(12) United States Patent
Fukuroi

(10) Patent No.: US 7,422,511 B2
(45) Date of Patent: Sep. 9, 2008

(54) ELEMENT FOR DETECTING THE AMOUNT OF LAPPING HAVING A RESISTIVE FILM ELECTRICALLY CONNECTED TO THE SUBSTRATE

(75) Inventor: Osamu Fukuroi, Laguna (PH)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 11/808,313

(22) Filed: Jun. 8, 2007

(65) Prior Publication Data

US 2008/0012556 A1    Jan. 17, 2008

(51) Int. Cl.
  *B24B 49/00* (2006.01)
(52) U.S. Cl. ............... 451/5; 451/9; 451/10; 451/41; 216/61; 29/603.12; 29/603.15; 156/345.28
(58) Field of Classification Search .............. 451/5, 451/8, 9, 10, 41; 216/61; 29/603.1, 603.12, 29/603.14, 603.15; 156/345.13, 345.15, 156/345.28
See application file for complete search history.

(56) References Cited

U.S. PATENT DOCUMENTS

| | | | | |
|---|---|---|---|---|
| 5,065,483 A | * | 11/1991 | Zammit | 29/603.09 |
| 5,463,805 A | * | 11/1995 | Mowry et al. | 29/603.09 |
| 5,772,493 A | * | 6/1998 | Rottmayer et al. | 451/5 |
| 6,230,389 B1 | * | 5/2001 | Zhu | 29/603.1 |
| 6,419,552 B2 | * | 7/2002 | Katoh et al. | 451/9 |
| 7,287,316 B2 | * | 10/2007 | Kasahara et al. | 29/737 |
| 7,359,148 B2 | * | 4/2008 | Yazawa | 360/125.01 |
| 2001/0034185 A1 | * | 10/2001 | Katoh et al. | 451/5 |
| 2002/0106974 A1 | * | 8/2002 | Fukuroi | 451/5 |
| 2004/0097173 A1 | * | 5/2004 | Crawforth et al. | 451/41 |
| 2005/0070206 A1 | * | 3/2005 | Kasiraj et al. | 451/5 |
| 2006/0068685 A1 | * | 3/2006 | Cyrille et al. | 451/8 |
| 2007/0270083 A1 | * | 11/2007 | Beaucage et al. | 451/8 |

FOREIGN PATENT DOCUMENTS

JP    2002-245606    8/2002

* cited by examiner

*Primary Examiner*—Eileen P. Morgan
(74) *Attorney, Agent, or Firm*—Nixon & Vanderhye P.C.

(57) ABSTRACT

An element for detecting an amount of lapping of a stacked structure that includes a substrate and a magnetic field detecting sensor is provided. The element comprises: a resistive film that is arranged on a lapping surface of the stacked structure, the resistive film being exposed at the lapping surface together with the magnetic field detecting sensor, wherein the resistive film has a resistance value that varies depending on the amount of lapping; and a pad for measuring the resistance value, wherein the pad is formed on a surface of the stacked structure, the surface being other than the lapping surface, and wherein the pad is electrically connected to one end of the resistive film. Another end of the resistive film is electrically connected to the substrate.

3 Claims, 5 Drawing Sheets

ELEMENT FOR DETECTING THE AMOUNT OF LAPPING HAVING A RESISTIVE FILM ELECTRICALLY CONNECTED TO THE SUBSTRATE

The present application is based on, and claims priority from, J.P. Application No. 2006-162211, filed on Jun. 12, 2006, the disclosure of which is hereby incorporated by reference herein in its entirety.

BACKGROUND OF THE INVENTION

1. Field of the Invention

The present invention relates to an element for detecting the amount of lapping that is used in a lapping step of a stacked structure of layers, a wafer that has such an element, and a method for lapping a stacked structure of layers using such an element. The present invention particularly relates to the structure of an element for detecting the amount of lapping that is used in a lapping step of a thin film magnetic head that is used in a hard disk drive.

2. Description of the Related Art

A thin film magnetic head that is used in a hard disk drive is manufactured through various manufacturing processes, which are generally classified into a wafer process, a slider process, and an assembly process. The wafer process involves forming a read head portion (magnetic field detecting sensor) and a write head portion on a wafer by means of thin film manufacturing technology. The slider process involves dicing the wafer into bars, lapping the bar in order to form an air bearing surface, and separating the bar into individual sliders. The assembly process involves incorporating the finished slider into an end product, such as a head gimbal assembly. In this specification, a surface of a bar or of a slider, which has not yet been lapped and which is to be formed into an air bearing surface after lapping, is called a lapping surface.

In the slider process, many sliders having predetermined dimensions are produced from a single wafer through a dicing process and a lapping process. Among various steps of the slider process, the lapping process for lapping the lapping surface and for forming the air bearing surface is important because the process controls the characteristics of the slider, particularly the characteristics of the read head portion. Consequently, accuracy in the order of nanometers is required in the lapping process, and various methods have been proposed. According to prior art, a method is known that involves providing elements for detecting the amount of lapping in spacing portions rather than in slider portions. The slider portions refer to portions which are actually to be formed into sliders, and the spacing portions refers to portions which are arranged between the slider portions and along which a bar is diced into sliders in a later step. The method further includes lapping the lapping surface while measuring the resistance value of the detecting elements in order to achieve desired dimensions of the read element. See, for example, Japanese Patent Laid-Open Publication No. 2002-245606. The outline of this lapping method will be briefly described.

In the wafer process, the spacing portions are normally provided on the peripheries of the slider portions. The spacing portions extend in two directions on the wafer. When the wafer is diced into bars along the spacing portions in one direction, the slider portions and the spacing portions that cross the spacing portions along which the wafer is diced are alternately arranged in each bar. Resistive films, which are called RLG (Resistance Lapping Guide) or ELG (Electric Lapping Guide) and which are used when the lapping surface is lapped, are formed in advance on the spacing portions which are arranged adjacent to the slider portions when the wafer is diced into bars. The resistive films are formed such that the top surfaces thereof are located beyond the position of the bar that is to be the air bearing surface, just as in the case of the read head portions. Both ends of the resistive film are electrically connected to two pads that are provided on the spacing portions of the wafer. When the lapping surface is lapped, the read head portions in the slider portions and the resistive films are simultaneously lapped, and the electric resistance of the resistive films changes as the cross section of the resistive films becomes small. The two pads are connected to a measuring device via wire bonding or probes in order to measure the electric resistance. The amount of lapping of the read head portions can be controlled by establishing the relationship between the resistance value of the resistive film and the amount of lapping in advance and by monitoring the resistance value.

This method has the advantage that damage to the read elements that may be caused by the ESD (Electro Static Discharge) can be prevented because the method utilizes portions that are finally cut and removed, rather than the portions that are to be formed into elements. Also, this method is effective when accurate measurement of the element resistance is difficult due to what is called smearing, which is caused by lapping an element, such as a TMR (Tunnel Magneto Resistive) element. According to Japanese Patent Laid-Open Publication No. 2002-245606, two pads in the form of triangles are arranged in a manner in which the long sides of the triangles are adjacent to each other so as to form a rectangle as a whole. This method reduces the possibility of entanglement or interference with adjacent wires that are connected to the pads, and therefore facilitates the arrangement of pads in a small area.

A pad having a certain size is required in order to ensure that the pad is connected with the measuring device via wire bonding or a probe. When wire bonding is used, a pad having a certain size is required due to restrictions on the wire diameter for wire bonding, accuracy of a wire bonding machine, etc. When a probe is used, pads need to be arranged at a specific interval due to restrictions on the probe diameter. This increases the area for arranging the pads. Consequently, a spacing portion is required to have a certain area in order to provide sufficient area for arranging the pads in prior art. However, an increase in the size of the spacing portions leads to a decrease in the number of sliders that can be produced from a single wafer. Since the size of spacing portions is constant irrespective of the size of sliders, a further reduction in the size of sliders, which is expected in the future, will relatively increase the ratio of the spacing portions in a wafer, which will limit cost reduction that is achieved based on high-density integration and the resultant increase in the number of elements which are produced from a single wafer. Further, a reduction in the size of a slider leads to a reduction in the height of a slider (the dimension of a slider that is measured in a direction perpendicular to the air bearing surface). This makes it difficult to provide two pads without significantly influencing the measurement. In case of a Femto size slider, which has a slider height of 230 µm, which is 70 µm smaller than that of a pico-slider, there is a limit to improvements or modifications to the pad shape or to the pad arrangement.

It may be possible to provide pads in the spacing portions between adjacent bars and to dice a wafer into blocks each having a plurality of bars that are arranged in parallel. In this case, each bar is lapped when it is in the form of a block, and when one row of the bars is lapped, the row is separated by dicing, and a similar step is repeated. It may be easy to reduce the width of the spacing portion within each bar in this method. However, it is difficult to provide pads for the last bar in the block, which may lead to deterioration in lapping accuracy. Furthermore, it may be difficult to reduce the width of the spacing portions between adjacent bars.

SUMMARY OF THE INVENTION

An object of the present invention is to provide an element for detecting the amount of lapping of a magnetic field detecting sensor which enables a reduction in the area for arranging pads.

According to an embodiment of the present invention, an element for detecting an amount of lapping of a stacked structure that includes a substrate and a magnetic field detecting sensor is provided. The element comprises: a resistive film that is arranged on a lapping surface of the stacked structure, the resistive film being exposed at the lapping surface together with the magnetic field detecting sensor, wherein the resistive film has a resistance value that varies depending on the amount of lapping; and a pad for measuring the resistance value, wherein the pad is formed on a surface of the stacked structure, the surface being other than the lapping surface, and wherein the pad is electrically connected to one end of the resistive film. Another end of the resistive film is electrically connected to the substrate.

Since one end of the resistive film is grounded to the substrate, unlike prior art, there is no need to provide two pads that are connected to the respective ends of the resistive film. Only one pad which is connected to one end of the resistive film is required. The pad needs a certain amount of area to enable a connection with a wire for wire bonding or to enable a connection with a probe. Therefore, the fact that only one pad is needed means that it is possible to significantly reduce the area that is required for arranging a pad. Accordingly, it is possible to produce a larger number of stacked structures of layers which include magnetic field detecting sensors from a single wafer.

The resistive film is preferably connected with the pad by means of a first via plug, and the resistive film is connected with the substrate by means of a second via plug, the first and second via plugs extending in the stacked structure in a direction of stacking.

A wafer comprises a spacing portion and a slider portion which is located adjacent to the spacing portion, wherein the slider portion includes the magnetic field detecting sensor and the spacing portion includes the element described above.

A method for lapping a stacked structure of layers, the method comprising the steps of: providing a stacked structure of layers which comprises a substrate, a magnetic field detecting sensor, a resistive film, and a pad, wherein the resistive film is arranged on a lapping surface of the stacked structure, the resistive film being exposed at the lapping surface together with the magnetic field detecting sensor, wherein one end of the resistive film is electrically connected to the substrate and another end of the resistive film is electrically connected to the pad; placing the substrate at ground potential; and lapping the lapping surface while monitoring a resistance value of the resistive film via the pad.

As described above, it is possible to halve the number of pads that are arranged according to the present invention. Accordingly, it is possible to provide an element for detecting the amount of lapping of a magnetic field detecting sensor which allows a reduction in the size of the area for arranging a pad.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1A:
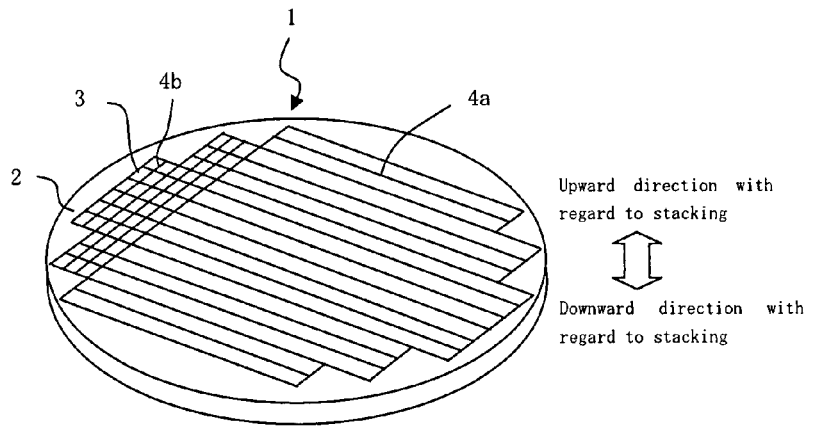
FIG. 1A is a perspective view of a wafer having elements for detecting the amount of lapping in accordance with an embodiment of the present embodiment.
Figure 1B:
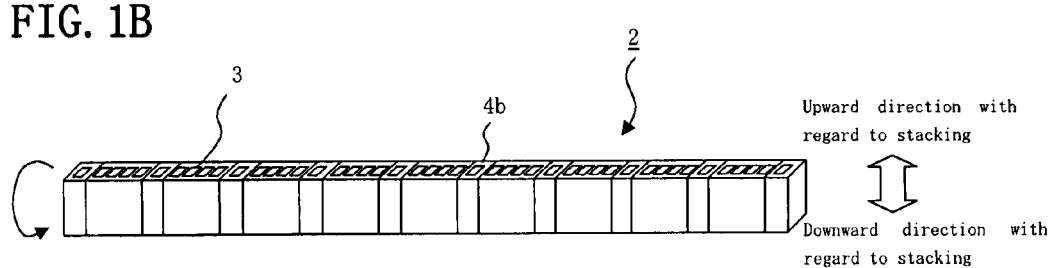
FIGS. 1B and 1C are perspective views of a bar having elements for detecting the amount of lapping in accordance with an embodiment of the present embodiment.
Figure 1C:
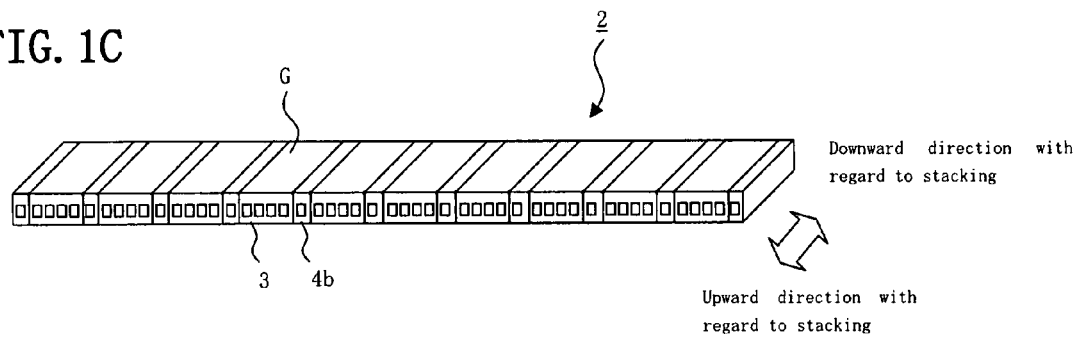

An element for detecting the amount of lapping in accordance with the present invention will be described with reference to the drawings. FIGS. 1A to 1C are perspective views of a wafer and bars having an element for detecting the amount of lapping in accordance with an embodiment of the present invention. FIG. 1A is a schematic view of a wafer, as viewed from the upper side of the wafer with regard to the direction of stacking (the direction is shown by the white arrow in the figure). Wafer 1 has a substrate, such as a silicon substrate, and many slider portions 3 which are two-dimensionally arranged on the substrate. Each slider portion 3 is formed into a slider that has a magnetic field detecting sensor (for example, MR element 10 which will be described later). Spacing portions 4a, 4b are formed on the periphery of each slider portion 3. FIG. 1B is a perspective view of a bar that is separated from the wafer by dicing, as, similar to FIG. 1, viewed from the upper side of the bar with regard to the direction of stacking (the direction is shown by the white arrow in the figure). FIG. 1C is a perspective view of the bar that is turned in the direction shown by the rotating arrow in FIG. 1B, i.e., as viewed when the dicing plane faces upward. As shown in FIG. 1A, wafer 1 is diced into bars 2 along spacing portions 4a. One of the dicing planes is lapping surface G that is to be lapped and formed into the air bearing surface. Bar 2 has slider portions 3 and spacing portions 4b in an alternating manner. Spacing portions 4b are used as the spacing portions when bar 2 is diced into individual sliders after lapping surface G of bar 2 is lapped and air bearing surface S is formed.

Figure 2:
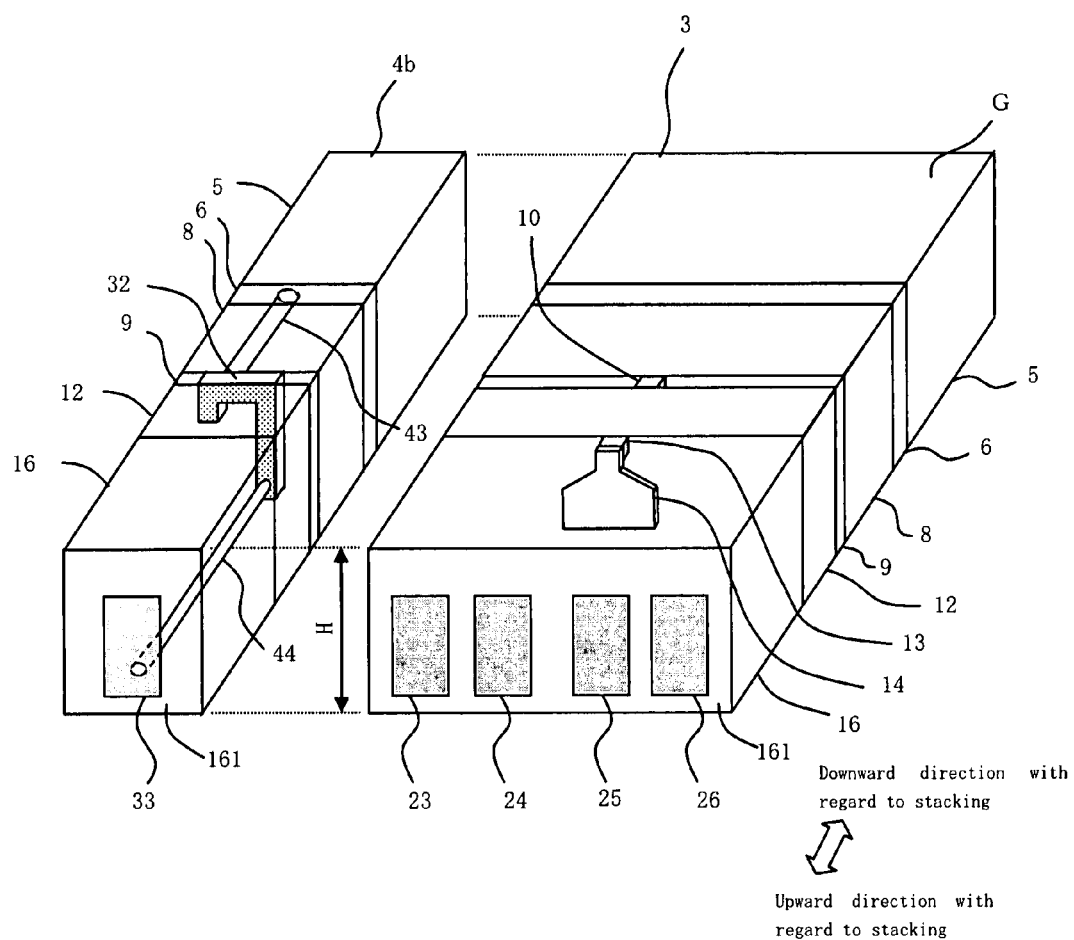
FIG. 2 is a partial enlarged view of a slider portion and a spacing portion.

FIG. 2 is a partial enlarged view of a stacked structure of layers that consist of a slider portion and a spacing portion, as viewed from the same direction as in FIG. 1C. FIG. 2 shows the slider portion and the spacing portion potion as being separated from each other, but these portions are actually integrated with each other.

Slider portion 3 is a structure in which substrate 5, insulating layer 6, lower shield layer 8, shield gap layer 9, MR element 10, and lower magnetic pole layer 12 are stacked in this order in the direction of stacking, and in which upper magnetic pole layer 14 and a coil, not shown, are further formed on lower magnetic pole layer 12. The entire slider portion 3 is covered with overcoat layer 16.

Substrate 5 is made of a ceramic material, such as AlTiC ($Al_2O_3.TiC$). Insulating layer 6, which is formed on substrate 5, is made of an insulating material, such as alumina ($Al_2O_3$). Lower shield layer 8 is made of, for example, perm-alloy (NiFe). Shield gap layer 9 is made of, for example, alumina. Shield gap layer 9 is formed by stacking a lower shield gap layer and an upper shield gap layer, although neither of them is shown. MR element 10, which is a read element, is shielded between the lower shield gap layer and the upper shield gap layer with a tip end thereof exposed at lapping surface G. MR element 10 is a magnetic field detecting sensor that is made of a magnetosensitive film, such as an AMR (Anisotropic Magneto Resistive) element, a GMR (Giant Magneto Resistive) element, and a TMR element, which exhibits a magnetoresistive effect.

Lower magnetic pole layer 12 functions as both a lower magnetic pole layer for the write head and an upper shield layer for the read head (MR element 10). Lower magnetic pole layer 12 is made of a magnetic material, such as perm-alloy and CoNiFe, which can be formed by plating. Electrodes, not shown, are connected to MR element 10 in order to supply sense current.

A write gap 13 is formed at lapping surface G between lower magnetic pole layer 12 and upper magnetic pole layer 14 in order to insulate lower magnetic pole layer 12 from upper magnetic pole layer 14. Write gap 13 is made of a nonmagnetic metal material, such as NiP, which can be formed by plating.

Upper magnetic pole layer 14 and lower magnetic pole layer 12 are connected together at a connection portion, not shown, to form a U-shaped conductor. A coil, not shown, is provided between upper magnetic pole layer 14 and lower magnetic pole layer 12 in a manner that the coil is wound around the connection portion. Overcoat layer 16, which is formed on the stacked layers, is made of an insulating material, such as alumina. Write pads 23, 24 and read pads 25, 26 are formed on the top surface of overcoat layer 16. Write pads 23, 24 are connected to the coil by via plugs, not shown. Read pads 25, 26 are connected to MR element 10 by via plugs, not shown, and electrodes.

Spacing portion 4b is a stacked structure of layers having a layer configuration that is similar to that of slider portion 3, although it is provided with neither a write element nor a read element. As shown in FIG. 2, substrate 5, insulating layer 6, lower shield layer 8, shield gap layer 9, and lower magnetic pole 12 are stacked in this order in the direction of stacking, and lower magnetic pole layer 12 is covered with overcoat layer 16. The characteristic part of spacing portion 4b is resistive film 32 that is formed therein, as shown in FIG. 2. Resistive film 32 is a sensor film that is called RLG or ELG. Resistive film 32 is provided at approximately the same depth with regard to the direction of stacking as MR element 10 in slider portion 3. Specifically, resistive film 32 is provided in shield gap layer 9. However, it should be noted that the depth of resistive element 32 is not limited to the same depth as that of MR element 10. For example, resistive element 32 may be arranged between MR element 10 and the write head portion. Lower shield layer 8 and lower magnetic pole layer 12 may be omitted. Resistive film 32 may have the same layer configuration as MR element 10, but may also be made of one of conductive metals, such as NiFe, Cu, NiCr, Au, and NiCu. Pad 33 is provided on top surface 161 of overcoat layer 16.

Figure 3:
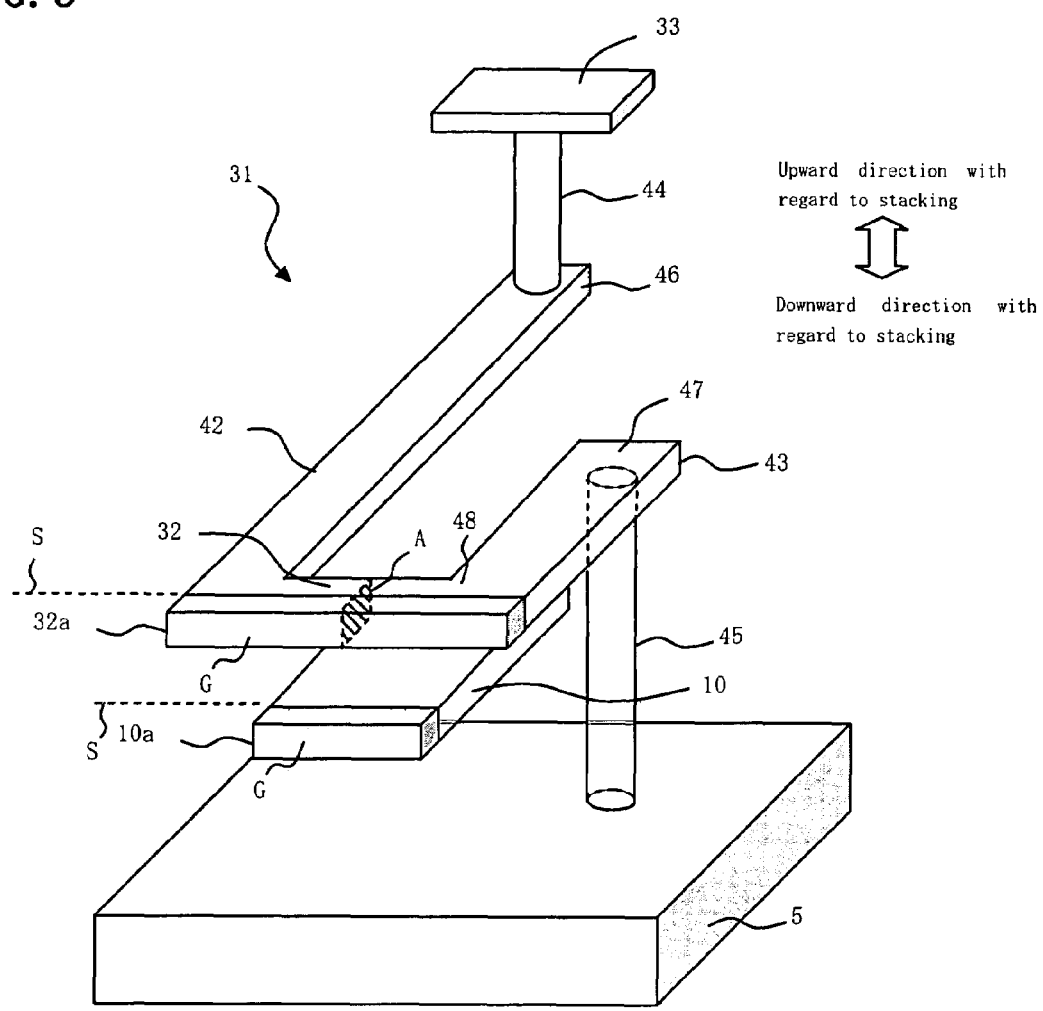
FIG. 3 is a conceptual perspective view showing, in general, the element for detecting the amount of lapping.

FIG. 3 is a conceptual perspective view showing, in general, the element for detecting the amount of lapping. Different from FIG. 2, FIG. 3 is a perspective view of the element for detecting the amount of lapping, as viewed in a state in which pad 33 faces upward i.e., as viewed from the same direction as in FIG. 1B. Some of elements other than the element for detecting the amount of lapping are omitted in the figure.

The element for detecting the amount of lapping 31 has resistive film 32 and pad 33, as described above. Resistive film 32 extends horizontally along lapping surface G. Lead portions 42, 43, which are electrically connected to resistive film 32, extend in a direction that is perpendicular to lapping surface G from the end portions of resistive film 32. The front surface of resistive film 32 constitutes lapped portion 32a that is exposed at lapping surface G. Lapped portion 32a is gradually removed as lapping progresses. MR element 10 also has lapped portion 10a that is exposed at lapping surface G. Lapped portion 10a is gradually removed as lapping progresses. When lapping is completed, air bearing surface S is formed on slider portion 3.

Via plug 44 is formed in the vicinity of end portion 46 of lead portion 42, which is located opposite to resistive film 32, and extends upward with regard to the direction of stacking. Via plug 44 is electrically connected to pad 33. On the other hand, via plug 45 is formed in the vicinity of end portion 47 of lead portion 43, which is located opposite to resistive film 32, and extends downward with regard to the direction of stacking. Via plug 45 is electrically connected to substrate 5. Pad 33 is provided in order to measure the resistance value of resistive film 32 that changes in accordance with lapping of lapped portion 32a. As shown in FIG. 2, pad 33 is provided on top surface 161 of overcoat layer 16 so that it is simultaneously formed together with write pads 23, 24 and read pads 25, 26. However, pad 33 may be formed on any surface other than lapping surface G of the stacked structure.

When lapping is performed, substrate 5 is grounded in an appropriate manner. Lead portion 43, which is electrically connected to substrate 5, and end portion 48 of resistive film 23 are placed at ground potential by grounding lead portion 43. Substrate 5 exhibits high conductivity if it is made of, for example, a sinter of 30% TiC and 70% $Al_2O_3$. Further, pad 33 is connected to a measuring device, not shown, by means of wire bonding or a probe. Lapped portion 32a of resistive film 32, as well as lapped portion 10a of MR element 10, are lapped as the lapping of surface G progresses. As the amount of lapping becomes large, the sectional area of resistive film 32 is reduced, and thus the resistance value of resistive film 32 is increased. Lapping is continued while the resistance value is monitored using the measuring device, and is completed when the resistance value reaches a predetermined resistance value. If the relationship between the resistance value and the amount of lapping of MR element 10 is determined in advance, then lapping can be finished at a predetermined MR height, which is the height of MR element 10 that is measured in a direction that is perpendicular to the air bearing surface.

According to the present invention, since one end of resistive film 32 is grounded to substrate 5, there is no need to provide two pads in each spacing portion as in prior art. Therefore, the width of spacing portion 4b is less restricted by a pad arrangement, and a reduction in the size of the spacing portion is facilitated. Even in case of a femto size slider, which has a reduced slider height H (see FIG. 2), as well as a reduced height of the spacing portion, the arrangement of the pad is easy because only one pad needs to be arranged. The number of the connection points for wire bonding is only one for each spacing portion. Therefore, interference with an adjacent wire is unlikely to occur, and accuracy in arranging wires can be mitigated. Similarly, if probes are used, then interference with an adjacent probe is unlikely to occur, and restrictions on the probe diameter can be mitigated. Moreover, since interference between adjacent wires or adjacent probes is unlikely to occur, connection with the pads is possible in various fashions, and a reduction in the size of the area of the pad itself is facilitated. It should be noted that although a via plug for connecting the resistive film with the substrate is additionally required in the present invention, the plug can be easily formed by means of a conventional technique with a minimum change in mask design.

The dimensions of the spacing portions and the pads were designed using the element for detecting the amount of lapping of the present invention. It was found that the width of the spacing portion was reduced from 120 μm to as small as 65 μm. The reduction in the width of the spacing portion allows about an increase of 7% in the number of sliders which can be produced from one wafer in case of femto size sliders.

Figure 4:
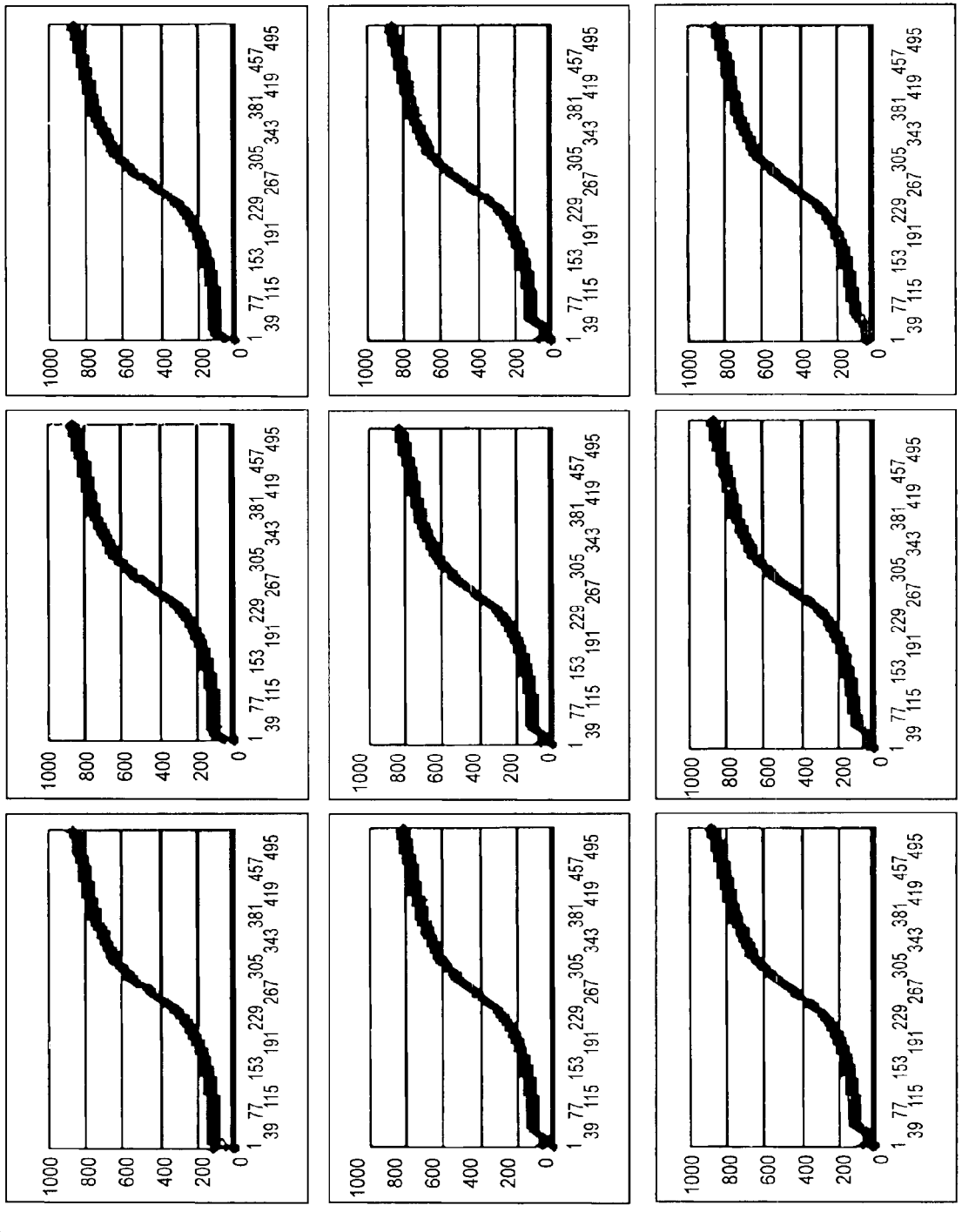
FIGS. 4 and 5 are graphs showing the relationship between lapping time and the resistance value of a resistive film that is provided in the element for detecting the amount of lapping in accordance with the present invention.
Figure 5:
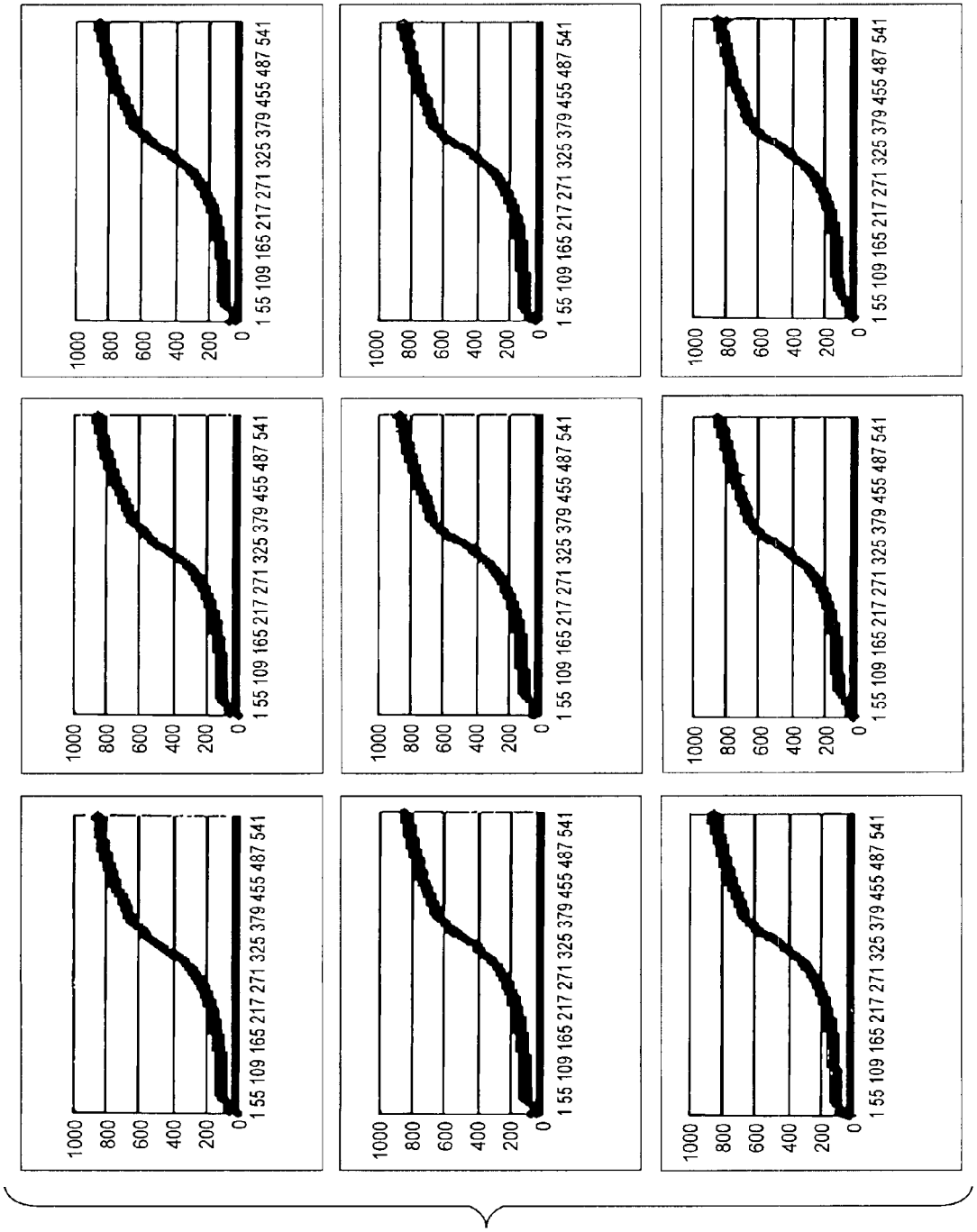

FIGS. 4 and 5 are graphs showing the relationship between the lapping time and the resistance value of the resistive film of the element for detecting the amount of lapping of the present invention. FIG. 4 shows the result of measurement of nine resistive films in a bar. FIG. 5 shows the result of measurement of nine resistive films in another bar. In both figures, the axis of abscissa indicates time, and the axis of ordinate indicates the resistance value. All graphs are depicted on the same scales. Lapping was performed until the DC resistance of resistive film 32 reached 30 ohm. It is commonly known that the resistance value is gradually increased with time (with lapping), and then the rate of increase becomes large, and then the rate is reduced again such that the curve represents an S-shape. It was found that the graphs which were obtained in this study exhibited curve shapes that are similar to that in prior art. It was also found that the resistive films in one bar, as well as the resistive films in different bars, exhibited almost the same curve shapes. This means that if the graphs are obtained in advance, then the amount of lapping of MR elements can be controlled using a conventional process.

Although a certain preferred embodiment of the present invention has been shown and described in detail, it should be understood that various changes and modifications may be made without departing from the spirit or scope of the appended claims.

What is claimed is:

1. An element for detecting an amount of lapping of a stacked structure of layers that includes a substrate and a magnetic field detecting sensor, the element comprising:
    a resistive film that is arranged on a lapping surface of said stacked structure, said resistive film being exposed at said lapping surface together with said magnetic field detecting sensor, wherein said resistive film has a resistance value that varies depending on the amount of lapping; and
    a pad for measuring said resistance value, wherein said pad is formed on a surface of said stacked structure, said surface being other than said lapping surface, and wherein said pad is electrically connected to one end of said resistive film,
    wherein another end of said resistive film is electrically connected to said substrate.

2. The element according to claim 1, wherein said resistive film is connected with said pad by means of a first via plug, and said resistive film is connected with said substrate by means of a second via plug, said first and second via plugs extending in said stacked structure in a direction of stacking.

3. A method for lapping a stacked structure of layers, said method comprising the steps of:
    providing a stacked structure of layers which comprises a substrate, a magnetic field detecting sensor, a resistive film, and a pad, wherein said resistive film is arranged on a lapping surface of said stacked structure, said resistive film being exposed at said lapping surface together with said magnetic field detecting sensor, wherein one end of said resistive film is electrically connected to said substrate and another end of said resistive film is electrically connected to said pad;
    placing said substrate at ground potential; and
    lapping said lapping surface while monitoring a resistance value of said resistive film via said pad.

* * * * *